(12) United States Patent
Carre et al.

(10) Patent No.: US 8,697,228 B2
(45) Date of Patent: Apr. 15, 2014

(54) CARRIER FOR GLASS SUBSTRATES

(75) Inventors: Alain R. E. Carre, Le Chatelet-en-Brie (FR); Eric J. P. Francois, Thomery (FR); Jean Waku-Nsimba, La Brosse-Montceaux (FR); Katrin Wondraczek, Erlangen (DE)

(73) Assignee: Corning Incorporated, Corning, NY (US)

( * ) Notice: Subject to any disclaimer, the term of this patent is extended or adjusted under 35 U.S.C. 154(b) by 264 days.

(21) Appl. No.: 12/772,416

(22) Filed: May 3, 2010

(65) Prior Publication Data
US 2011/0111194 A1  May 12, 2011

(30) Foreign Application Priority Data

May 6, 2009  (EP) .................................... 09305404

(51) Int. Cl.
*B32B 7/02* (2006.01)
*C09J 7/02* (2006.01)

(52) U.S. Cl.
USPC .......................................... 428/215; 428/337

(58) Field of Classification Search
None
See application file for complete search history.

(56) References Cited

U.S. PATENT DOCUMENTS

| | | | |
|---|---|---|---|
| 4,395,451 A | 7/1983 | Althouse | 428/141 |
| 5,869,150 A | 2/1999 | Iwamoto | 428/1 |
| 5,972,152 A | 10/1999 | Lake et al. | 156/247 |
| 6,596,569 B1 * | 7/2003 | Bao et al. | 438/151 |
| 6,634,686 B2 | 10/2003 | Hosokawa | 294/902 |
| 6,687,969 B1 | 2/2004 | Dando | 29/423 |
| 6,815,070 B1 * | 11/2004 | Burkle et al. | 428/425.6 |
| 6,879,370 B2 | 4/2005 | Yokoue et al. | 349/190 |
| 6,934,001 B2 | 8/2005 | Nishiki | 349/187 |
| 7,060,590 B2 | 6/2006 | Bressot et al. | 438/455 |
| 7,198,853 B2 | 4/2007 | Ushio et al. | 428/447 |
| 8,157,945 B2 | 4/2012 | Higuchi | 156/247 |
| 2002/0031628 A1 * | 3/2002 | Zumbrum et al. | 428/36.9 |

(Continued)

FOREIGN PATENT DOCUMENTS

| JP | 2006-327641 A1 | 12/2006 |
|---|---|---|
| WO | 2005/048669 | 5/2005 |

(Continued)

OTHER PUBLICATIONS

G.A.C.M. Spierings, et al., "Direct bonding of organic materials," *Appl. Phys. Lett.*, Jun. 13, 1994, vol. 64, No. 24, pp. 3246-3248.

(Continued)

*Primary Examiner* — David Sample
*Assistant Examiner* — Nicole T Gugliotta
(74) *Attorney, Agent, or Firm* — Kevin M. Able (57) ABSTRACT

A carrier (31) for a thin glass sheet (7) is disclosed. The carrier includes an elastomer (9) which has first (15) and second (17) opposed surfaces and a support (11) bonded to the first surface (15) of the elastomer (9). During use, the thin glass sheet (7) directly contacts and is releasably bonded to the elastomer's second surface (17). In order to provide a strong, yet releasable bond to the thin glass sheet (7), the elastomer's second surface (17) has a Shore A hardness in the range of 10-90 and a roughness less than or equal to 185 nanometers. In this way, the carrier/glass sheet assembly (13) is able to withstand the conditions encountered during manufacture of electronic components on the exposed surface (23) of the thin glass sheet (7).

8 Claims, 5 Drawing Sheets

(56) References Cited

U.S. PATENT DOCUMENTS

| | | | |
|---|---|---|---|
| 2005/0129909 A1* | 6/2005 | Hermens et al. | 428/138 |
| 2005/0136625 A1 | 6/2005 | Henseler et al. | 438/479 |
| 2005/0164472 A1 | 7/2005 | Brod et al. | 438/460 |
| 2005/0167036 A1 | 8/2005 | Yokoyama et al. | 156/230 |
| 2006/0194363 A1 | 8/2006 | Giesberg et al. | 438/99 |
| 2008/0099134 A1 | 5/2008 | Tadakuma | 156/250 |
| 2008/0135175 A1 | 6/2008 | Higuchi | 156/344 |
| 2009/0004388 A1* | 1/2009 | Larmer et al. | 427/299 |
| 2009/0148682 A1 | 6/2009 | Higuchi | 428/213 |
| 2009/0321005 A1 | 12/2009 | Higuchi et al. | 156/249 |
| 2010/0038023 A1 | 2/2010 | Kho et al. | 156/247 |
| 2011/0048611 A1* | 3/2011 | Carre et al. | 156/73.1 |

FOREIGN PATENT DOCUMENTS

| | | |
|---|---|---|
| WO | 2011/024689 | 3/2011 |
| WO | 2011/024690 | 3/2011 |
| WO | 2011/024775 | 3/2011 |

OTHER PUBLICATIONS

M. Waris, et al., "Adhesive-free bonding of Zerodur glass to silicon," *Applied Surface Science*, 2006, vol. 252, pp. 7327-7330.

H. Luoto, et al., "Direct Bonding of Thick Film Polysilicon to Glass Substrates," *Journal of the Electrochemical Society*, 2006, vol. 153, No. 11, pp. G981-G985.

G.A.C.M. Spierings, et al., "Direct bonding of organic polymeric materials," *Philips Journal of Research*, 1995, vol. 49, Nos. 1/2, pp. 139-149.

* cited by examiner

CARRIER FOR GLASS SUBSTRATES

CLAIMING BENEFIT OF PRIOR FILED APPLICATION

This application claims the benefit of European Application Serial No. 09305404.7, filed on May 6, 2009. The content of this document and the entire disclosure of publications, patents, and patent documents mentioned herein are incorporated by reference.

FIELD

This disclosure relates to the manufacture of electronic components on glass substrates (glass sheets) and, in particular, to a carrier for supporting thin substrates during such manufacture.

DEFINITION

As used herein and in the claims, the word "glass" includes both glass and glass-ceramic materials.

BACKGROUND

A variety of electronic components including thin film transistors (TFTs) are manufactured on glass substrates in, for example, the production of pixelized displays, e.g., liquid crystal displays (LCD) and organic light emitting diode (OLED) displays. The standard substrate thickness for this application has been 0.7 millimeters, and display manufacturers have sophisticated manufacturing equipment in place for use with such substrates.

Recently, substantially thinner substrates have been produced by glass manufacturers, e.g., substrates having a thickness down to 0.1 millimeters and below. In order to be processed, such thin substrates need to be temporarily bonded to a thicker carrier that will release the substrate without damage at the end of the fabrication process. In addition, it would be desirable if the carrier could be reused at least several times without the need for an extensive recycling procedure. Furthermore, to take advantage of existing equipment, the carrier/substrate assembly should preferably be suitable for processing using conventional equipment and reagents employed in the manufacture of electronic components, including TFTs, with little or no modification.

Although a variety of approaches to this problem have been proposed, to date, a solution to the problem has eluded the art. The problem has proved challenging because of the competing requirements which the carrier must meet including 1) the ability to withstand the chemical treatments and elevated temperatures employed during the manufacture of electronic components on glass substrates, 2) the ability to firmly retain the glass substrate on the carrier during the manufacturing process with no relative movement between the substrate and the carrier and essentially zero failures since a failure can mean a shutdown of an entire manufacturing line, and 3) the ability to release the glass substrate and the electronic components formed thereon after the manufacturing process with no damage to either.

As discussed fully below, in accordance with the present disclosure, a carrier structure and critical parameters for the interface between the carrier and the glass substrate have been found which allow all of the above requirements to be met simultaneously.

SUMMARY

In accordance with a first aspect, a carrier (31) for a thin glass sheet (7) which has a thickness which is less than or equal to 0.5 millimeters is disclosed that includes:

(A) an elastomer (9) which has first (15) and second (17) opposed surfaces; and (B) a support (11) bonded to the first surface (15) of the elastomer (9), the support (11) having a thickness which ranges from one to ten times the thickness of the thin glass sheet (7);

wherein:

(i) during use, the thin glass sheet (7) directly contacts and is releasably bonded to the elastomer's second surface (17);

(ii) the elastomer's second surface (17) has:

(a) a Shore A hardness in the range of 10-90, and (b) a roughness (Ra value) less than or equal to 185 nanometers; and (iii) the bond between the first surface (15) and the support (11) has a peel strength of at least 0.5 kilonewtons/meter when measured at a peeling speed of 20 millimeters/minute and a peeling angle of 90°.

In accordance with a second aspect, an assembly (13) is disclosed which includes the carrier (31) of the first aspect and a thin glass sheet (7) whose thickness is less than or equal to 0.5 millimeters.

The reference numbers used in the above summaries of the various aspects of the disclosure are only for the convenience of the reader and are not intended to and should not be interpreted as limiting the scope of the invention. More generally, it is to be understood that both the foregoing general description and the following detailed description are merely exemplary of the invention and are intended to provide an overview or framework for understanding the nature and character of the invention.

Additional features and advantages of the invention are set forth in the detailed description which follows, and in part will be readily apparent to those skilled in the art from that description or recognized by practicing the invention as described herein. The accompanying drawings are included to provide a further understanding of the invention, and are incorporated in and constitute a part of this specification. It is to be understood that the various features of the invention disclosed in this specification and in the drawings can be used in any and all combinations.

BRIEF DESCRIPTION OF THE DRAWINGS

FIGS. 1-3 are not to scale and are not intended to show the relative sizes of the components illustrated. The reference numbers used in the figures correspond to the following:

7 thin glass substrate
9 elastomer
11 support
13 carrier/thin glass substrate assembly
15 first surface of elastomer
17 second surface of elastomer
19 glass cylinder
21 adhesion energy testing apparatus
23 exposed surface of thin glass substrate
25 bonding surface of thin glass substrate
27 elastomer layer
31 carrier

DETAILED DESCRIPTION OF THE PREFERRED EMBODIMENT

Figure 1:
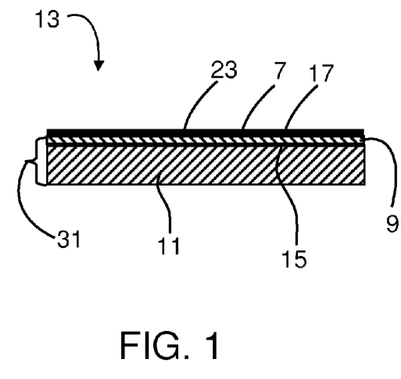
FIG. 1 is a schematic drawing of an embodiment of a carrier with a thin glass sheet releasably bonded thereto.
Figure 2:
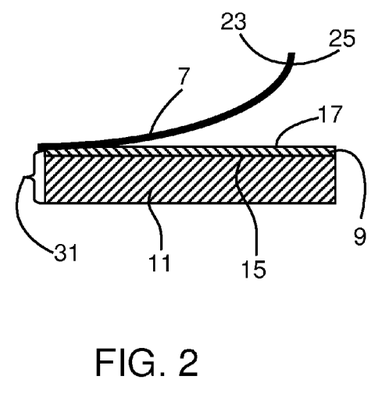
FIG. 2 is a schematic drawing illustrating the removal of a thin glass sheet from the carrier of FIG. 1.

The structural aspects of the disclosure are illustrated in FIGS. 1 and 2. As shown therein, carrier 31 comprises an elastomer 9 which has a first surface 15 and a second surface 17. The first surface 15 is bonded to support 11 and the second surface 17 makes direct contact with glass sheet 7, specifically with surface 25 of glass sheet 7, during use of the carrier. During such use, electronic components are formed on exposed surface 23 of glass sheet 7.

Glass sheet 7 can have a variety of compositions. Representative compositions include those used for liquid crystal displays, e.g., Corning Incorporated's EAGLE XG glass, NEG's OA-20 glass, and Asahi's AN-100 glass. Unlike conventional LCD glass, the thickness of glass sheet 7 is less than or equal to 0.5 millimeters, e.g., the thickness can be below 0.1 millimeters. The glass can be bare or coated with any polymer or molecule that can provide desired properties, such as, protection from abrasion, modulation of adhesion and/or reduction of fragility. As examples, perfluorooctadecyltrichlorosilane can be used to modulate the glass adhesion to the elastomer and polyimide can be used to reduce glass fragility.

Support 11 can also have a variety of compositions. Typically, it will be composed of glass, e.g., the same glass as glass sheet 7, but it can also be composed of a different glass or a metal, e.g., stainless steel. Support 11 has a thickness in the range of 1 to 10 times the thickness of glass sheet 7. In one embodiment, support 11 has a thickness in the range of the glass substrates used to manufacture LCD displays, e.g., 0.7 millimeters. Support 11's length and width can vary widely depending on the size of the thin glass sheet which is to be supported. For reference, Gen 5 substrates used in the manufacture of LCD displays have a surface area for a single side in the range of 1.5 meter$^2$. Support 11 can have a similar surface area or, depending on the application, a smaller or larger area.

Elastomer 9 performs the important functions of providing a substantially non-releasable bond with support 11 at surface 15 and a strong but releasable bond with glass sheet 7 at surface 17. Depending on the application, elastomer 9 can cover the entire surface of support 11 or only portions of that surface. Partial coverage can be used to adjust the releasable bond between elastomer 9 and thin glass sheet 7. The thickness of elastomer 9 can vary widely, e.g., it can be in the range of 0.1 to several millimeters. The Young's modulus of the elastomer can also be in a broad range. For example, it can be on the order of 1 to 10 MPa, e.g., on the order of 1 to 5 MPa. To obtain an elastomer layer having a sufficiently smooth surface 17, the elastomer can be covered during curing with a smooth hydrophobized glass sheet, e.g., a glass sheet that has been hydrophobized by vapor deposition of a thin layer of a perfluorosilane (e.g., perfluorodecyltrichlorosilane).

Preferably, the elastomer is a non-polar elastomer, examples of which include silicone elastomers, fluorosilicone elastomers and perfluoroelastomers. Of these, perfluoroelastomers are particularly well suited for many applications because of their total replacement of hydrogen atoms by fluorine atoms and their ability to achieve perfect cross-linking, which together lead to low levels of outgassing (e.g., no detectable outgassing after a 1 hour soak at 325° C.) and high levels of thermal and chemical stability, e.g., thermal stability up to 400° C. and higher chemical durability than silicones and fluorosilicones. The perfluoroelastomers can exhibit higher bonding energies to glass than silicone elastomers which can be an additional advantage for some applications depending on the composition of thin glass sheet 7 and support 11.

Silicone elastomers have the advantage that their adhesion levels can be simply adjusted by varying the amount of cross-linker used during curing. However, unreacted cross-linker and/or low molecular weight species in the final product may generate unacceptable levels of outgassing during the manufacture of electronic components. As discussed above, perfluoroelastomers are typically free of outgassing issues.

In terms of the substantially non-releasable bond with support 11, depending on the composition of the support, some elastomers can form such a bond by being coated onto the support and cured in place. Adhesion can be promoted by varying the vulcanization rate. See Gent, The Journal of Adhesion, 79, pp 315-325, (2003). For other elastomers, an adhesion promoter may be helpful in achieving the requisite level of bonding. See L. Léger, Macromol. Symp. 149, pp 197-205 (2000).

For example, in the case of perfluoroelastomers and a support composed of glass, one or more fluorinated silanes, e.g., FDS (perfluorooctadecyltrichlorosilane), may be used as an adhesion promoter. The fluorinated silane can be vapour-deposited on the glass so that the fluorinated chain will penetrate into the perfluoroelastomer and as a result improve adhesion between the elastomer and the glass support.

An adhesive can also be used to attach the elastomer to the support, but this approach is generally not preferred because of the potential for contamination of electronic components formed on surface 23 of the thin glass sheet 7 during use of the carrier. Adhesives differ from adhesion promoters in terms of polymer molecular weight. Thus, adhesives are generally macromolecular polymers while adhesion promoters are molecular polymers, so that the molecular weights of adhesives are substantially greater than those of adhesion promoters.

However formed, the bond between the elastomer and the support needs to have a peel strength sufficiently high so that the elastomer remains attached to the support as glass sheet 7 is peeled from the elastomer once processing of the carrier/glass sheet assembly has been completed. Quantitatively, the bond between surface 15 of elastomer 9 and support 11 needs to have a peel strength of at least 0.5 kilonewtons/meter when measured at a peeling speed of 20 millimeters/minute and a peeling angle of 90 degrees to achieve this functionality. The peel strength is measured using an INSTRON® machine configured to measure tensile strength. For a given peeling speed and angle, i.e., 20 millimeters/minute and 90 degrees for the interface between elastomer 9 and support 11, the tensile load is monitored and converted into energy.

Compared to the bond between elastomer 9 and support 11, the bond between the elastomer and the thin glass sheet needs to be weaker, but not so weak as to release the glass sheet during processing. As demonstrated by the examples presented below, it has been discovered that this challenging balance between, on the one hand, generating enough bonding and, on the other, generating too much bonding can be achieved by ensuring that surface 17 of elastomer 9 has (i) a Shore A hardness in the range of 10-90 and (ii) a roughness less than or equal to 185 nanometers, e.g., a roughness on the order of 100 nanometers or less.

Shore A hardness is a normalized test used to measure the hardness of soft materials. Like other hardness tests, an indentor penetrates the material under a given force, and the indentation depth (i.e., the material's resistance to the penetration) is used to determine the Shore A hardness value. Roughness is measured using a scanning interferometric microscope which contains a reference surface for which the interferometric fingerprint (=surface quality) is known. To determine a sample's roughness, a lighting source illuminates both the sample and the reference surface. The reflected light from the sample and the reference surface is recombined to give an interferometric fingerprint that depends on the roughness of the sample and is converted into a roughness value in nanometers.

In addition to the Shore A hardness and surface roughness tests, elastomer 9 can also be characterized by testing under conditions that the carrier/glass sheet assembly will encounter during the manufacture of electronic components and, in particular, the conditions most likely to cause separation between the sheet and the carrier. Those conditions can be effectively approximated by testing samples of the assembly in an ultrasonic (50/60 hertz) acetone bath at 25° C. for 20 minutes. The severity of this test is sufficient to distinguish between assemblies that can be used in practice with essentially zero failures and those that cannot. Quantitatively, if more than 45% of the samples survive the test, i.e., if the probability that glass sheet 7 will be retained on surface 17 is greater than 45%, then the failure rate in practice will be essentially zero.

It should be noted that the bond between thin glass sheet 7 and surface 17 is of the Van der Waals type. Accordingly, removal of the thin glass sheet from surface 17 does little damage to the surface. This, in turn, means that the carrier can be reused, which represents a significant economic advantage since a non-reusable carrier would mean that more material (e.g., more glass in the case where support 11 is made of glass) would be consumed in manufacturing than would end up in the final product (e.g., up to ten times more glass for a support ten times thicker than thin glass sheet 7).

EXAMPLES

The following non-limiting examples further illustrate embodiments of the disclosure. The adhesion energies reported in the examples were determined using the rolling cylinder test schematically illustrated in FIG. 3. See M. E. R. Shanahan, A. Carré, Viscoelastic dissipation in wetting and adhesion phenomena, Langmuir, 11, p. 1396, 1995.

Figure 3:
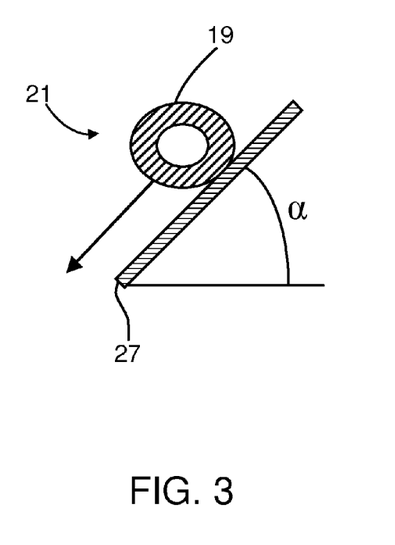
FIG. 3 is a schematic drawing illustrating experimental apparatus for measuring the adhesion energy between an elastomer and a glass surface.
Figure 4:
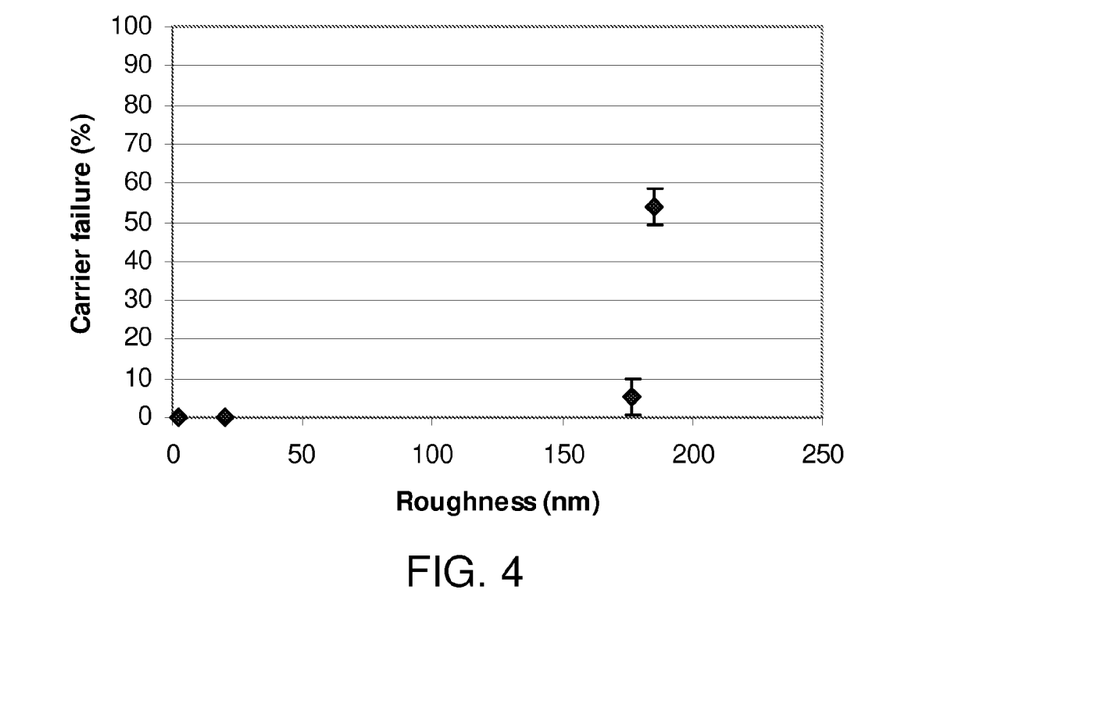
FIG. 4 is a graph of carrier failure versus surface roughness for a silicone elastomer having a Shore® A hardness of 10.
Figure 5:
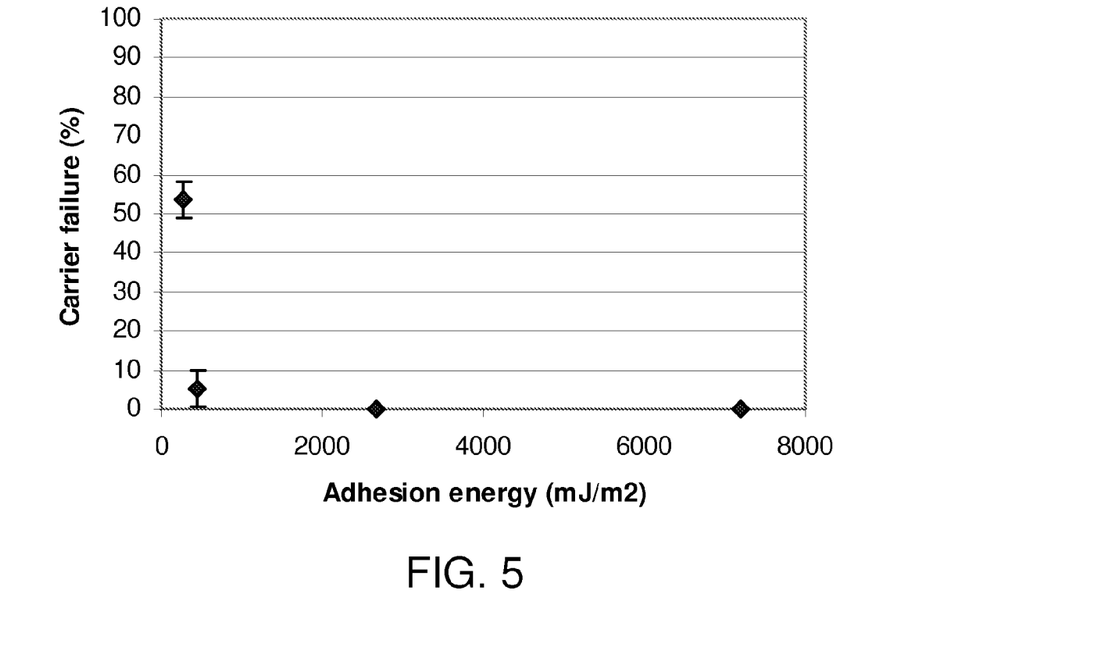
FIG. 5 is a graph of carrier failure versus adhesion energy for the silicone elastomer and Shore A hardness of FIG. 4. The adhesion energy was determined for a cylinder composed of polished Pyrex® glass and a cylinder speed of 0.1 meters/second.
Figure 6:
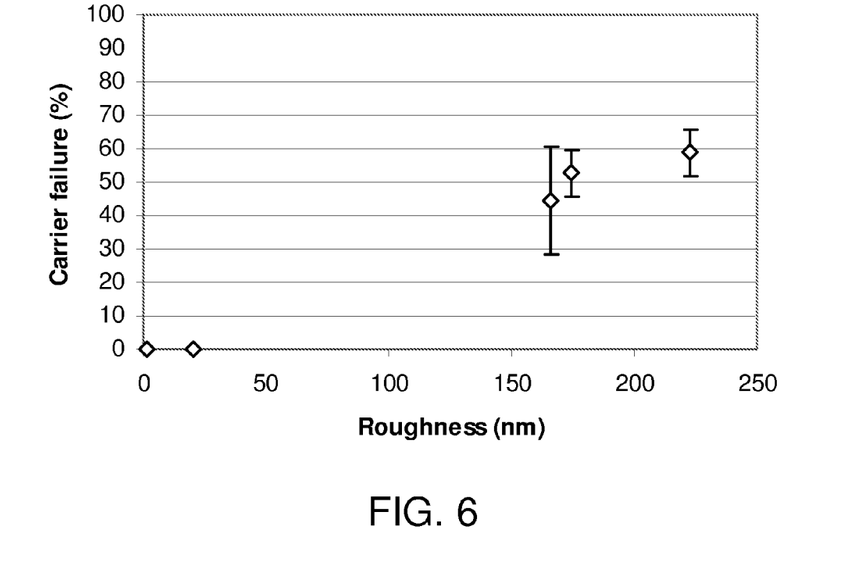
FIG. 6 is a graph of carrier failure versus surface roughness for a silicone elastomer having a Shore A hardness of 22.
Figure 7:
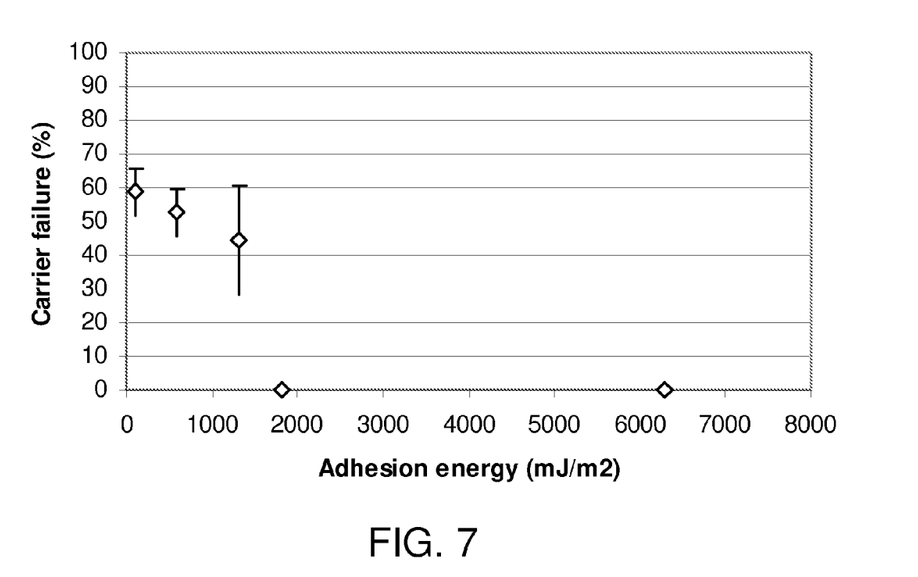
FIG. 7 is a graph of carrier failure versus adhesion energy for the silicone elastomer and Shore A hardness of FIG. 6. The adhesion energy was determined for a cylinder composed of polished Pyrex glass and a cylinder speed of 0.1 meters/second.
Figure 8:
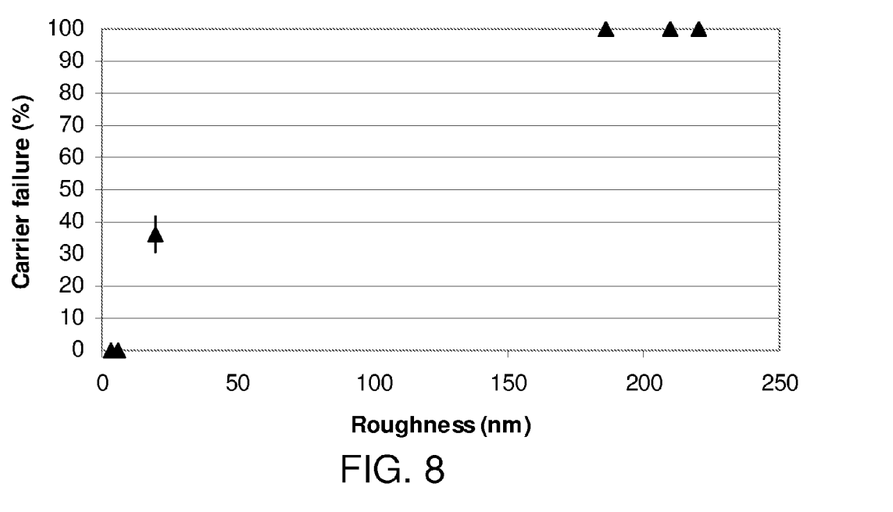
FIG. 8 is a graph of carrier failure versus surface roughness for a silicone elastomer having a Shore A hardness of 33.
Figure 9:
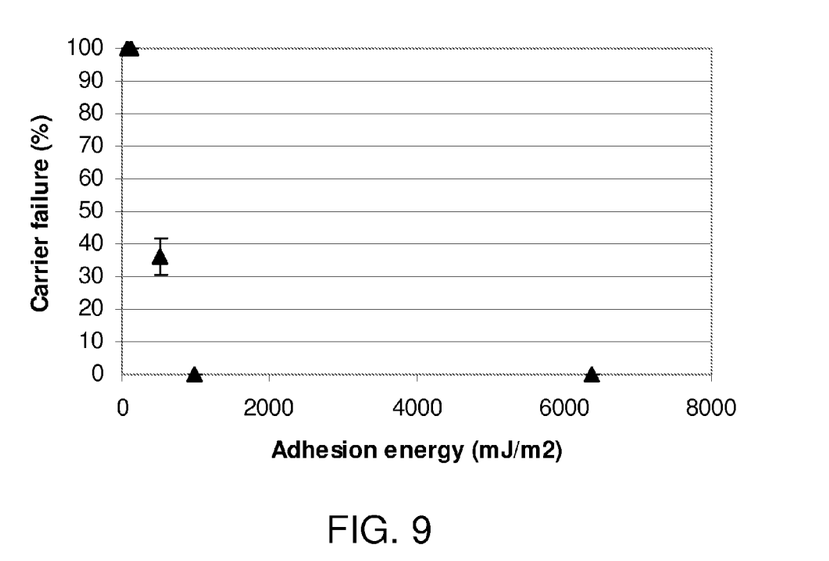
FIG. 9 is a graph of carrier failure versus adhesion energy for the silicone elastomer and Shore A hardness of FIG. 8. The adhesion energy was determined for a cylinder composed of polished Pyrex glass and a cylinder speed of 0.1 meters/second.
Figure 10:
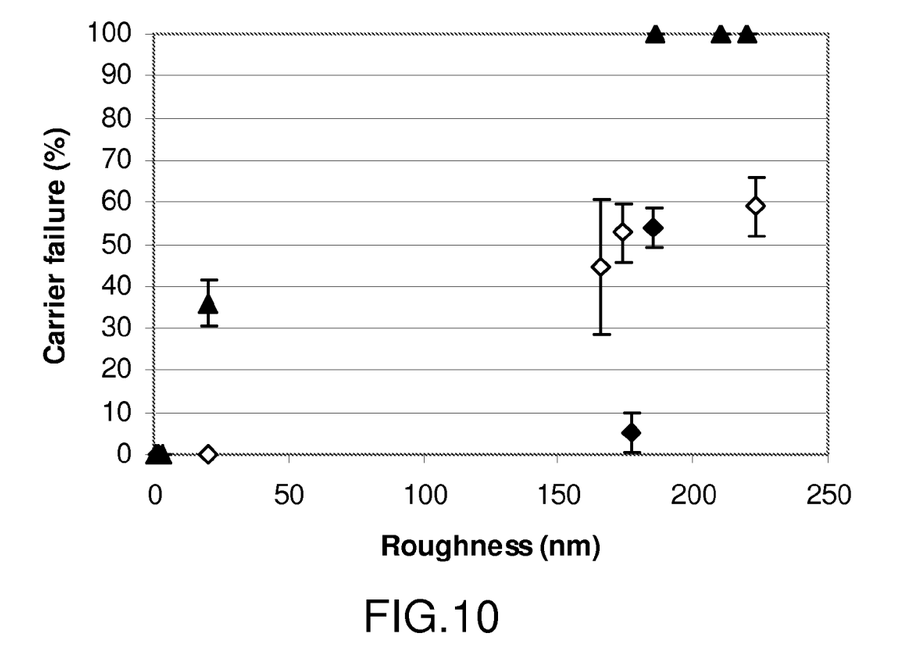
FIG. 10 is a graph of carrier failure versus surface roughness which combines the data of FIGS. 4, 6, and 8. In this figure, the filled diamonds, open diamonds, and filled triangles represent the 10, 22, and 33 Shore A hardness data, respectively.
Figure 11:
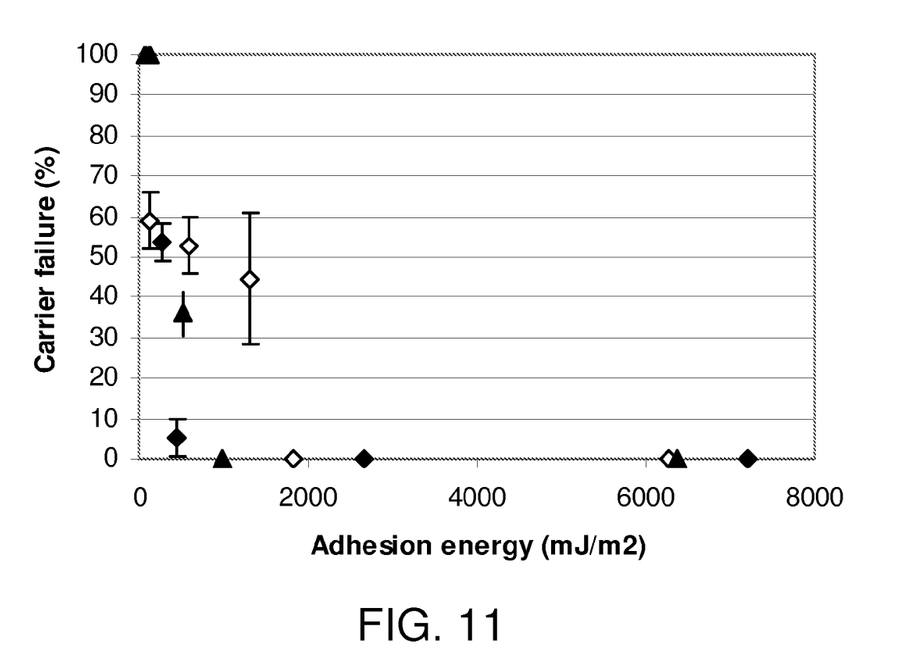
FIG. 11 is a graph of carrier failure versus adhesion energy which combines the data of FIGS. 5, 7, and 9. In this figure, the filled diamonds, open diamonds, and filled triangles represent the 10, 22, and 33 Shore A hardness data, respectively.

Apparatus 21 employed in this test includes a plane having an adjustable angle of inclination $\alpha$. A layer 27 of the elastomer being tested is affixed to the plane and as shown by the arrow, a cylinder 19 of glass is rolled down the plane. The velocity of the cylinder is measured for a given angle $\alpha$ The energy of adhesion G(v) in joules/meter$^2$ is then calculated from the equation:

$$G(v)=(m \cdot g \cdot \sin(\alpha))/w$$

where g is the gravitational constant and m and w are the mass and width of the cylinder, respectively.

Example 1

This example illustrates the effects of Shore A hardness and surface roughness on the ability of a carrier/glass sheet assembly to withstand the conditions likely to be encountered during the manufacture of electronic components.

A "robustness" test was performed of the type described above, i.e., samples of the assembly were treated in an ultrasonic (50/60 hertz) acetone bath at 25° C. for 20 minutes and the number of samples that failed/survived the test were determined. Due to the severity of the test, a survival probability greater than 45% (failure rate below 55%) was considered acceptable.

The tests were performed using a silicone elastomer which had been bonded to Corning Incorporated's EAGLE XG™ glass by direct cross-linking on the glass surface after elastomer press-molding. Glass sheets composed of EAGLE XG glass were applied to the exposed surface of the silicone elastomer. Elastomer samples having three Shore A hardness values (10, 22, and 33) and a variety of surface roughnesses were tested. Adhesion energies were determined using the rolling cylinder test of FIG. 3. The cylinder was composed of polished Pyrex glass. The test velocity ranged from 0.2 millimeters/second to 0.1 meters/second.

The test results are shown in Tables 1, 2, and 3 and FIGS. 4-11. As can be seen from this data, the Shore A hardness and surface roughness values interact with one another such that the surface roughness can be greater for lower Shore A hardness values. However, in general, the combination of a low surface roughness value and a low Shore A value gives the highest adhesion energies and the highest carrier success rates.

Example 2

This example compares a silicone elastomer with a perfluoroelastomer in a test intended to simulate the TFT deposition process.

Carrier/glass sheet assemblies were subjected to two 20 minute exposures to ultrasonic cleaning of the type described in Example 1 above, as well as 5 minutes in concentrated photoresist developer and 14 hours of Au and chrome etching at 270° C. Both the silicone elastomer and the perfluoroelastomer performed well in the ultrasonic cleaning and photoresist tests. The perfluoroelastomer did better than the silicone elastomer in the etching-at-elevated-temperature test, but both were acceptable. After the testing was completed, the glass sheet could be more easily removed from the perfluoroelastomer than from the silicone elastomer.

In further comparison tests, silicone elastomers and perfluoroelastomers were compared with regard to thermal stability and outgassing. The perfluoroelastomers were stable to temperatures above 425° C., while the silicone elastomers were not. In an outgassing test, no outgassing was observed for a perfluoroelastomer held at 325° C. for 1 hour, while a silicone elastomer exhibited outgassing of cyclic siloxanes under the same conditions. However, outgassing from silicone rubber RT622 from Wacker Chemie AG can be drastically reduced by a preheating in a stove (e.g., for 10 hours at 200° C.). This treatment reduces outgassing during TFT processing.

Adhesion energy experiments using the rolling cylinder test of FIG. 3 were also performed on silicone elastomers and perfluoroelastomers. The experiments showed that the perfluoroelastomers generated consistently higher adhesion energy values than the silicone elastomers, in some cases as much as 40 times higher.

In view of the results of these experiments, although silicone elastomers can be used for many applications, the perfluoroelastomers have a wider range of applicability and are thus preferred.

A variety of modifications that do not depart from the scope and spirit of the invention will be evident to persons of ordinary skill in the art from the foregoing disclosure. The following claims are intended to cover the specific embodiments set forth herein as well as modifications, variations, and equivalents of those embodiments.

TABLE 1

Shore A Hardness = 10

| Roughness Ra (nm) | Energy (mJ/m2) | Carrier failure (%) | Carrier success (%) |
|---|---|---|---|
| 185 | 263 | 54 ± 5 | 46 |
| 177 | 452 | 5 ± 5 | 95 |
| 20 | 2672 | 0 ± 0 | 100 |
| 2 | 7200 | 0 ± 0 | 100 |

TABLE 2

Shore A Hardness = 22

| Roughness Ra (nm) | Energy (mJ/m2) | Carrier failure (%) | Carrier success (%) |
|---|---|---|---|
| 223 | 115 | 59 ± 7 | 41 |
| 174 | 602 | 53 ± 7 | 47 |
| 166 | 1320 | 44 ± 16 | 56 |
| 20 | 1822 | 0 ± 0 | 100 |
| 2 | 6283 | 0 ± 0 | 100 |

TABLE 3

Shore A Hardness = 33

| Roughness Ra (nm) | Energy (mJ/m2) | Carrier failure (%) | Carrier success (%) |
|---|---|---|---|
| 220 | 73 | 100 ± 0 | 0 |
| 210 | — | 100 ± 0 | 0 |
| 186 | 117 | 100 ± 0 | 0 |
| 20 | 522 | 36 ± 5 | 64 |
| 3 | 987 | 0 ± 0 | 100 |
| 1 | 6374 | 0 ± 0 | 100 |

What is claimed is:

1. A carrier for a thin glass sheet which has a thickness which is less than or equal to 0.5 millimeters, the carrier comprising:
    a perfluoroelastomer which has first and second opposed surfaces;
    a glass support bonded to the first surface of the perfluoroelastomer, the glass support having a thickness which ranges from one to ten times the thickness of the thin glass sheet; and
    a fluorinated silane adhesion promoter between the perfluoroelastomer and the glass support;
    wherein:
    (i) during use, the thin glass sheet directly contacts and is releasably bonded to the perfluoroelastomer's second surface;
    (ii) the perfluoroelastomer's second surface has:
        (a) a Shore A hardness in the range of 10-90, and
        (b) a roughness less than or equal to 185 nanometers; and
    (iii) the bond between the first surface of the perfluoroelastomer and the support has a peel strength of at least 0.5 kilonewtons/meter when measured at a peeling speed of 20 millimeters/minute and a peeling angle of 90°.

2. The carrier of claim 1 wherein the probability of a thin glass sheet being retained on the second surface for 20 minutes when placed in a 50 or 60 hertz ultrasonic acetone bath at 25° C. is greater than 45%.

3. The carrier of claim 1 wherein the adhesion promoter is perfluorooctadecyltrichlorosilane.

4. An assembly comprising the carrier of claim 1 and a thin glass sheet whose thickness is less than or equal to 0.5 millimeters.

5. An assembly comprising the carrier of claim 3 and a thin glass sheet whose thickness is less than or equal to 0.5 millimeters.

6. The assembly of claim 4 wherein the thin glass sheet comprises a glass suitable for use as a substrate for a pixelized display.

7. The assembly of claim 5 wherein the thin glass sheet comprises a glass suitable for use as a substrate for a pixelized display.

8. A carrier for a thin glass sheet having a thickness less than or equal to 0.5 millimeters, the carrier comprising:
    a perfluoroelastomer having first and second opposed surfaces;
    a glass support bonded to the first surface of the perfluoroelastomer, the glass support having a thickness that ranges from one to ten times the thickness of the thin glass sheet; and
    a perfluorooctadecyltrichlorosilane adhesion promoter between the perfluoroelastomer and the glass support;
    wherein:
    (i) during use, the thin glass sheet directly contacts and is releasably bonded to the perfluoroelastomer's second surface;
    (ii) the perfluoroelastomer's second surface having:
        (a) a Shore A hardness in the range of 10-90, and
        (b) a roughness less than or equal to 185 nanometers; and
    (iii) the bond between the first surface and the glass support has a peel strength of at least 0.5 kilonewtons/meter when measured at a peeling speed of 20 millimeters/minute and a peeling angle of 90°.

* * * * *